(12) United States Patent  
Xian et al.

(10) Patent No.: US 11,249,351 B2
(45) Date of Patent: Feb. 15, 2022

(54) ARRAY SUBSTRATE AND DISPLAY DEVICE

(71) Applicant: BOE Technology Group Co., Ltd., Beijing (CN)

(72) Inventors: Jianbo Xian, Beijing (CN); Pan Li, Beijing (CN); Yong Qiao, Beijing (CN); Xinyin Wu, Beijing (CN); Jian Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 130 days.

(21) Appl. No.: 16/882,948

(22) Filed: May 26, 2020

(65) Prior Publication Data

US 2020/0285121 A1 Sep. 10, 2020

Related U.S. Application Data

(63) Continuation of application No. 15/741,919, filed as application No. PCT/CN2017/082436 on Apr. 28, 2017, now Pat. No. 10,705,389.

(30) Foreign Application Priority Data

May 31, 2016 (CN) .......................... 201620520143.X

(51) Int. Cl.
G02F 1/1343 (2006.01)
G02F 1/1362 (2006.01)
(Continued)

(52) U.S. Cl.
CPC .. *G02F 1/134309* (2013.01); *G02F 1/136209* (2013.01); *G02F 1/136286* (2013.01);
(Continued)

(58) Field of Classification Search
CPC ........... G02F 1/134309; H01L 27/1225; H01L 29/78633
See application file for complete search history.

(56) References Cited

U.S. PATENT DOCUMENTS 5,600,461 A * 2/1997 Ueda ................. G02F 1/136213
349/38
7,479,419 B2 1/2009 Cho et al.
8,178,883 B2 5/2012 Cho et al.
2006/0262244 A1* 11/2006 Cho .................... H01L 27/1214
349/84

(Continued)

FOREIGN PATENT DOCUMENTS

CN 1866083 A 11/2006
CN 103779362 A 5/2014
CN 205645811 U 10/2016

OTHER PUBLICATIONS

Transmittal, International Search Report and Written Opinion for International Application No. PCT/CN2017/082436, dated Aug. 8, 2017, 16 pages.

(Continued)

*Primary Examiner* — Omar F Mojaddedi
(74) *Attorney, Agent, or Firm* — Westman, Champlin & Koehler, P.A.

(57) ABSTRACT

Embodiments of the present disclosure provide an array substrate and a display device. The array substrate includes a plurality of gate lines and a plurality of data lines, the plurality of gate lines and the plurality of data lines crossing one another to bound pixel units and the pixel unites each including a pixel electrode and a thin film transistor, which includes a drain electrode, the array substrate further includes a common electrode line, the drain electrode includes an extension portion and the common electrode line and the extension portion form a light blocking structure together such that an orthographic projection of the light blocking structure on a plane where the pixel electrode is located is located near an edge of the pixel electrode. The array substrate provided by the present disclosure is applied to a display device.

20 Claims, 7 Drawing Sheets

(51) Int. Cl.
  *H01L 27/12* (2006.01)
  *H01L 29/786* (2006.01)
  *H01L 21/02* (2006.01)

(52) U.S. Cl.
  CPC ........ *H01L 27/124* (2013.01); *H01L 27/1225* (2013.01); *H01L 29/78633* (2013.01); *G02F 2201/121* (2013.01); *G02F 2201/122* (2013.01); *G02F 2201/123* (2013.01); *H01L 21/0262* (2013.01); *H01L 21/02532* (2013.01); *H01L 21/02565* (2013.01); *H01L 21/02592* (2013.01); *H01L 21/02631* (2013.01); *H01L 27/127* (2013.01); *H01L 27/1222* (2013.01); *H01L 29/7869* (2013.01); *H01L 29/78669* (2013.01)

(56) References Cited

U.S. PATENT DOCUMENTS

| | | | |
|---|---|---|---|
| 2009/0159895 A1 | 6/2009 | Cho et al. | |
| 2013/0214278 A1* | 8/2013 | Nam | H01L 27/124 257/59 |
| 2017/0299908 A1* | 10/2017 | Peng | G02F 1/133345 |
| 2018/0203305 A1 | 7/2018 | Xian et al. | |

OTHER PUBLICATIONS

USPTO-issued prosecution for U.S. Appl. No. 15/741,919, filed Jan. 4, 2018, including: Requirement for Restriction dated Feb. 15, 2019, 9 pages, Non-Final Rejection dated Nov. 18, 2019, 7 pages, and Notice of Allowance dated Mar. 19, 2020, 14 pages, 30 pages total.

* cited by examiner

ARRAY SUBSTRATE AND DISPLAY DEVICE

CROSS-REFERENCE TO RELATED APPLICATION(S)

The present application is a continuation application (CA) of an application with U.S. application Ser. No. 15/741,919, which claims priority to a Chinese Patent Application No. 201620520143.X filed on May 31, 2016, entitled "array substrate and display device", the entire contents of which are hereby incorporated by reference as part of this application.

TECHNICAL FIELD

Embodiments of the present disclosure relate to the field of display technology, and particularly, to an array substrate and a display device.

BACKGROUND

With development of the display technology, a liquid crystal display device has gradually replaced a conventional picture tube display device and became a mainstream of current display devices.

The liquid crystal display device is formed by assembling an array substrate and a color filter substrate and injecting liquid crystal between them. On the array substrate, gate lines and data lines are provided and cross each other to bound pixel units. The liquid crystal display device includes a pixel electrode and a common electrode and an electric field is formed between the pixel electrode and the common electrode. A liquid crystal molecule is deflected by changing a voltage of the electric field, and a picture is disposed by the deflection of the liquid crystal molecule in cooperation with the color filter layer.

When the liquid crystal display device displays the picture, the electric field at an edge of the pixel electrode is weak and thus the liquid crystal molecule is difficult to be deflected in that region, which in turn affects display quality of the display device.

SUMMARY

Embodiments of the present disclosure provide an array substrate and a display device, with which display quality of the display device can be improved.

Embodiments of the present disclosure provide the following schemes:

In accordance with an aspect, embodiments of the present disclosure provide an array substrate including a plurality of gate lines extending generally along a first direction and a plurality of data lines extending generally along a second direction, the first direction and the second direction being perpendicular to each other, the gate lines and the data lines crossing to define a plurality of pixel units, each of the pixel units comprising a pixel electrode and a thin film transistor and the thin film transistor comprising a drain, wherein the drain comprises a drain extension, and the drain extension comprises a first extension line, a second extension line, and a third extension line, wherein the first extension line extends in the first direction, the second extension line and the third extension line extend in the second direction, and the first extension line is located between the second extension line and the third extension line;

the array substrate further comprises a common electrode line and an orthographic projection of the common electrode line on the plane where the pixel electrode is located and an orthographic projection of the first extension line on the plane where the pixel electrode is located do not overlap; and the orthographic projection of the common electrode line on the plane where the pixel electrode is located overlaps orthographic projections of the second extension line and the third extension line on the plane where the pixel electrode is located.

In accordance with another aspect, embodiments of the present disclosure provide an array substrate, including:

a plurality of gate lines extending generally in a first direction and a plurality of data lines extending generally in a second direction, the first direction and the second direction being perpendicular to each other, the gate lines and the data lines crossing to define a plurality of pixel units, each of which includes a pixel electrode and a thin film transistor;

wherein, the array substrate further includes a common electrode line, wherein the common electrode line includes a first portion extending in the first direction, a second portion and a third portion extending in the second direction;

orthographic projections of the second portion of the common electrode line and the third portion of the common electrode line on a plane where the pixel electrode is located are respectively parallel to and are not equally distanced to opposite edges of the pixel electrode extending in the second direction.

In accordance with another aspect, embodiments of the present disclosure provide a display device including the above array substrate.

The display device provided by the embodiments of the present disclosure at least has the same advantages as the above array substrate, which are not repeatedly described herein.

BRIEF DESCRIPTION OF THE DRAWINGS

The drawings described herein are provided to further understand the present disclosure and constitute a portion of the present disclosure. The exemplary embodiments and their description of the present disclosure are intended to interpret the present invention, instead of limiting the present invention. In the drawings.

DETAILED DESCRIPTION

In order that the objectives, characteristics and advantages of the technical solutions of the present disclosure are apparent and readily appreciated, the technical solutions of the embodiments of the present disclosure will be clearly and completely described in the following context in conjunction with the accompanying drawings. It is apparent that the described embodiments are only a part of the embodiments of the present disclosure but not all of the embodiments. All other embodiments obtained by those skilled in the art based on the illustrated embodiments of the present disclosure without any inventive labors fall within the scope of the present disclosure.

Figure 1:
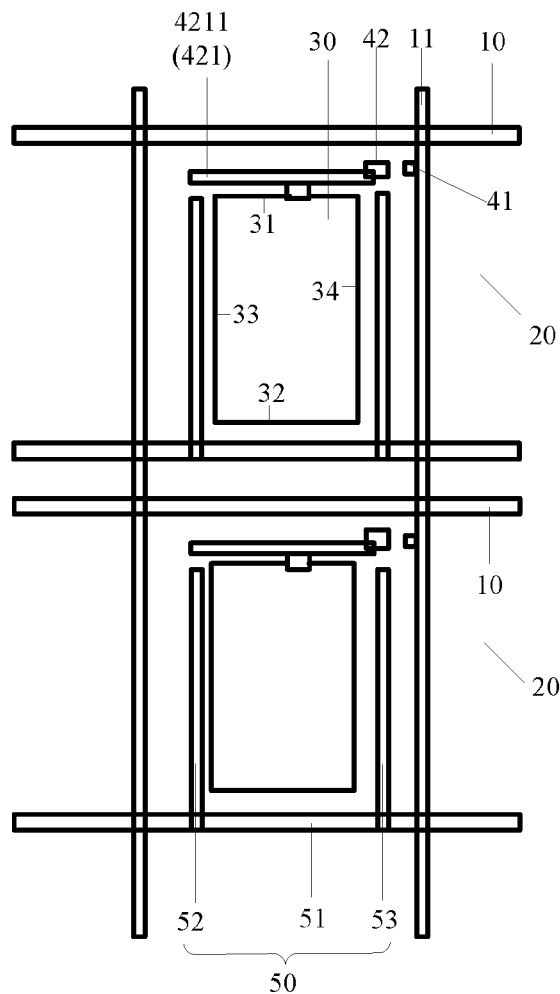
FIG. 1 is a schematic structural view of an array substrate according to an embodiment of the present disclosure.

Referring to FIG. 1, embodiments of the present disclosure provide an array substrate including a plurality of gate lines 10 and a plurality of data lines 11 that cross each other; the plurality of gate lines 10 and the plurality of data lines 11 cross each other to bound pixel units 20. For example, every two adjacent gate lines 10 together with two adjacent data lines 11 bound a pixel unit 20. Each pixel unit 20 includes a pixel electrode 30 and a thin film transistor, and the thin film transistor includes a gate electrode, a source electrode 41 and a drain electrode 42. The gate electrode is connected to the gate line 10, the source electrode 41 is connected to the data line 11 and the drain electrode 42 is connected to the pixel electrode 30. Of course, in an embodiment, the gate electrode may be integral with the gate line as a one-piece structure. The array substrate in the embodiment further includes a common electrode line 50, the drain electrode 42 includes an extension portion 421 and the common electrode line 50 and the extension portion 421 cooperate with each other to form a light blocking structure such that an orthographic projection of the light blocking structure on a plane where the pixel electrode 30 is located is located at an edge of the pixel electrode 30, forming a corresponding projection of the light blocking structure. In other words, an orthographic projection of the common electrode line 50 on the plane where the pixel electrode 30 is located, and an orthographic projection of the extension portion 421 on the plane where the pixel electrode 30 is located surround the edge of the pixel electrode 30 together, forming the projection of the light blocking structure. Of course, the projection of the light blocking structure may be closed, or may be unclosed.

In the present embodiment, the drain electrode 42 of the thin film transistor on the array substrate is extended to form the extension portion 421 while the common electrode line 50 is provided on the array substrate such that the orthographic projection of the extension portion 421 on the plane where the pixel electrode 30 is located, together with the orthographic projection of the common electrode line 50 on the plane where the pixel electrode 30 is located, forms a projection of the light blocking structure. The projection of the light blocking structure surrounds the edge of the pixel electrode 30 such that the light blocking structure corresponding to the projection of the light blocking structure can function to block light at the edge of the pixel electrode 30, reducing light leakage at the edge area of the pixel electrode 30 as much as possible and thus improving display quality of the display device.

In the present embodiment, the orthographic projection formed by vertically projecting the light blocking structure on the plane where the pixel electrode 30 is located may be a projection of the light blocking structure that is closed and surrounds the edge of the pixel electrode 30, or that is not closed and surrounds the edge of the pixel electrode 30. Meanwhile, in the embodiment a shape of the light blocking structure is not limited to a specific shape and the specific shape of the light blocking structure may be set according to an actual shape of the pixel electrode 30 or other conditions.

The light blocking structure may have various forms and four forms are illustrated in the embodiment for reference.

It is noted that in the following embodiment, for ease of understanding, the shape of the pixel electrode 30 is assumed as a rectangular shape but it is not limited to this. The pixel electrode 30 has a rectangular edge constituted by a first edge 31, a second edge 32, a third edge 33 and a fourth edge 34. The first edge 31 and the second edge 32 are opposite to each other as a group and herein, may be considered as an upper edge and a lower edge of the rectangular edge of the pixel electrode 30, respectively, and the third edge 33 and the four edge 34 are opposite to each other as a group and herein, may be considered as a left edge and a right edge relative to the upper edge and the lower edge of the rectangular edge of the pixel electrode 30, respectively. Accordingly, it may be assumed that the light blocking structure also includes four sides accordingly and correspondingly, the projection of the light blocking structure also includes four sides that surround the edge 30 of the pixel electrode.

FIG. 1 may be referred to for a first form of the light blocking structure. In FIG. 1, the extension portion 421 is extended from the drain electrode 42 with the drain electrode 42 as a trunk, and includes a first extension line 4211 parallel to the first edge 31 of the pixel electrode 30 and an orthographic projection of the first extension line 4211 on the plane where the pixel electrode 30 is located is located at the first edge 31 of the pixel electrode such that the first extension line 4211 forms one side of the light blocking structure. The common electrode line 50 includes a first portion 51 parallel to the second edge 32 of the pixel electrode 30, a second portion 52 located at the third edge 33 of the pixel electrode 30 and a third portion 53 located at the fourth edge 34 of the pixel electrode 30. An orthographic projection of the first portion 51 on the plane where the pixel electrode 30 is located is located at the second edge 32 of the pixel electrode 30, an orthographic projection of the second portion 52 on the plane where the pixel electrode 30 is located is located at the third edge 33 of the pixel electrode 30 and an orthographic projection of the third portion 53 on the plane where the pixel electrode 30 is located is located at the fourth edge 34 of the pixel electrode 30 Thereby the three portions of the common electrode line 50 form other three sides of the light blocking structure.

It is noted that in this disclosure, for example, the orthographic projection of the first extension line 4211 on the plane where the pixel electrode 30 is located being located at the first edge 31 of the pixel electrode should be understood as the orthographic projection of the first extension line 4211 on the plane where the pixel electrode 30 is located being located at or near the first edge 31 of the pixel electrode; similarly, the orthographic projection of the first portion 51 on the plane where the pixel electrode 30 is located being located at the second edge 32 of the pixel electrode 30 should be understood as the orthographic projection of the first portion 51 on the plane where the pixel electrode 30 is located being located at or near the second edge 32 of the pixel electrode 30; the orthographic projection of the second portion 52 on the plane where the pixel electrode 30 is located being located at the third edge 33 of the pixel electrode 30 should be understood as the orthographic projection of the second portion 52 on the plane where the pixel electrode 30 is located being located at or near the third edge 33 of the pixel electrode 30; the orthographic projection of the third portion 53 on the plane where the pixel electrode 30 is located being located at the fourth edge 34 of the pixel electrode 30 should be understood as the orthographic projection of the third portion 53 on the plane where the pixel electrode 30 is located being located at or near the fourth edge 34 of the pixel electrode 30.

In the first form, a total length of the light blocking structure of at least one pixel unit is greater than or equal to ¾ of a sum of lengths of the sides of the corresponding pixel electrode, thereby obtaining a good light blocking effect.

Optionally, in the first form, the total length of the light blocking structure of at least one pixel unit is in a range of ⅞-15/16 of the sum of the lengths of the sides of the corresponding pixel electrode.

For example, in the embodiment, the light blocking structure includes the first portion 51, the second portion 52 and the third portion 53 of the common electrode line 50 and the extension portion 421 of the drain electrode; the total length of the light blocking structure is equal to a sum of the lengths of the first portion 51, the second portion 52 and the third portion 53 of the common electrode line 50 and the extension portion 421 of the drain electrode. The sum of lengths of the sides of the corresponding pixel electrode is a sum of the lengths of the sides of the pixel electrode 30 which respectively correspond to the first edge 31, the second edge 32, the third edge 33 and the fourth edge 34.

In the first form, the orthographic projection of the second portion 52 on the plane where the pixel electrode 30 is located and the orthographic projection of the third portion 53 on the plane where the pixel electrode 30 is located may be connected with the orthographic projection of the first portion 51 on the plane where the pixel electrode 30 is located, so that the orthographic projection of the common electrode line 50 in the plane is an integral structure that has no gap and has a good light blocking performance.

Further, based on the rectangle pixel electrode 30, the orthographic projection of the second portion 52 on the plane where the pixel electrode 30 is located and the orthographic projection of the third portion 53 on the plane where the pixel electrode 30 is located may be perpendicular to the orthographic projection of the first portion 51 on the plane where the pixel electrode 30 is located, thereby forming a light blocking structure in a rectangle shape.

Figure 2:
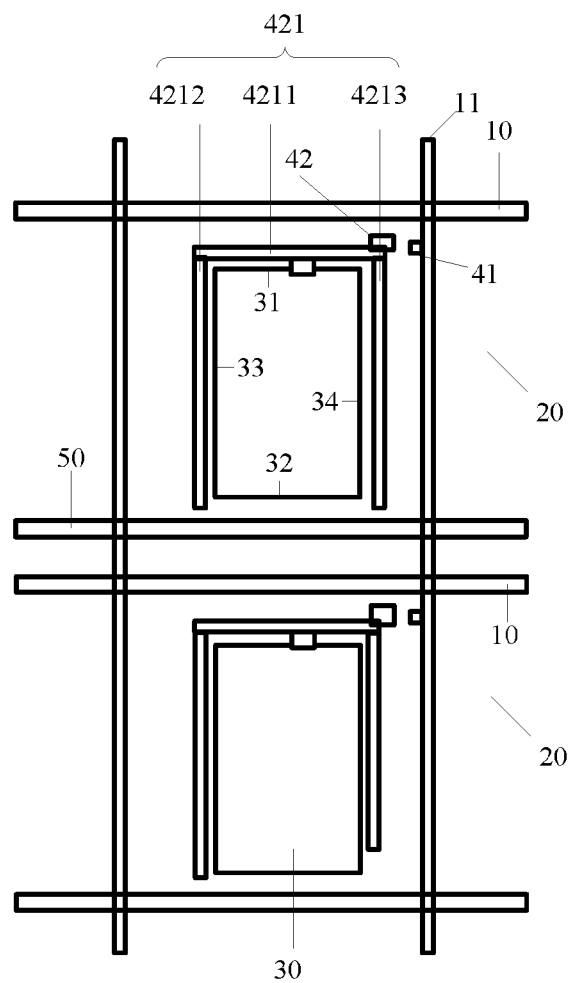
FIG. 2 is a schematic structural view of an array substrate according to an embodiment of the present disclosure.

FIG. 2 may be referred to for a second form of the light blocking structure. In FIG. 2, the extension portion 421 is extended from the drain electrode 42 with the drain electrode 42 as a trunk, and comprises a first extension line 4211 parallel to the first edge 31 of the pixel electrode 30 and further comprises a second extension line 4212 and a third extension line 4213 that extend from the first extension line 4211. An orthographic projection of the first extension line 4211 on the plane where the pixel electrode 30 is located is located at the first edge 31 of the pixel electrode, an orthographic projection of the second extension line 4212 on the plane where the pixel electrode 30 is located is located at the third edge 33 of the pixel electrode and an orthographic projection of the third extension line 4213 on the plane where the pixel electrode 30 is located is located at the fourth edge 34 of the pixel electrode, so that the portions of the extension portion 421 form three sides of the light blocking structure. The common electrode line 50 is parallel to the second edge 32 of the pixel electrode 30 and the orthographic projection of the common electrode line 50 on the plane where the pixel electrode 30 is located is located at the second edge 32 of the pixel electrode, so that the common electrode line 50 forms the other side of the light blocking structure.

In the second form of the light blocking structure, based on the rectangle pixel electrode 30, the second extension line 4212 and the third extension line 4213 are both perpendicular to the first extension line 4211 so as to form a rectangle light blocking structure. In other words, the light blocking structure includes the first extension line 4211, the second extension line 4212, the third extension line 4213 and the common electrode line 50.

Figure 3:
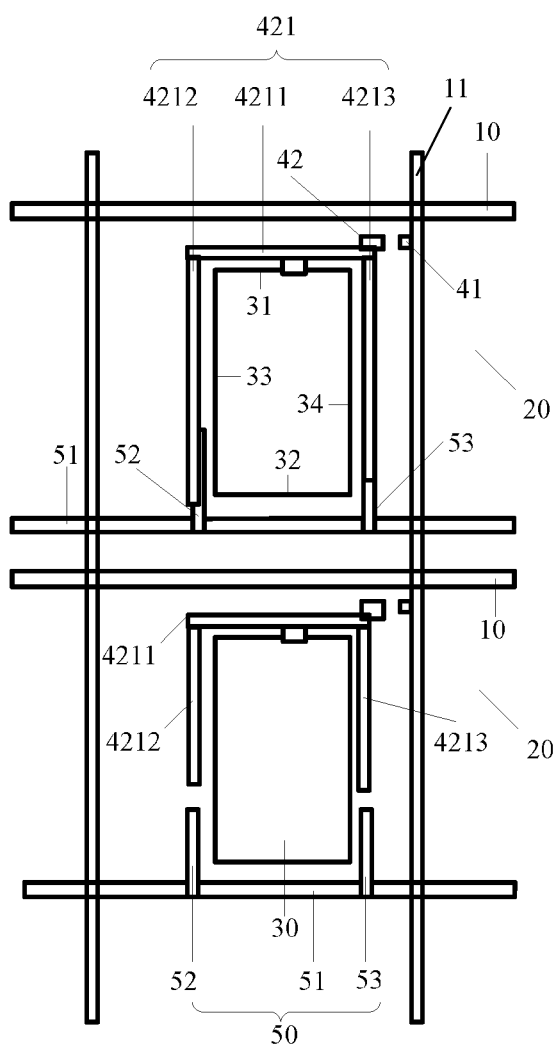
FIG. 3 is a schematic structural view of an array substrate according to an embodiment of the present disclosure.
Figure 4:
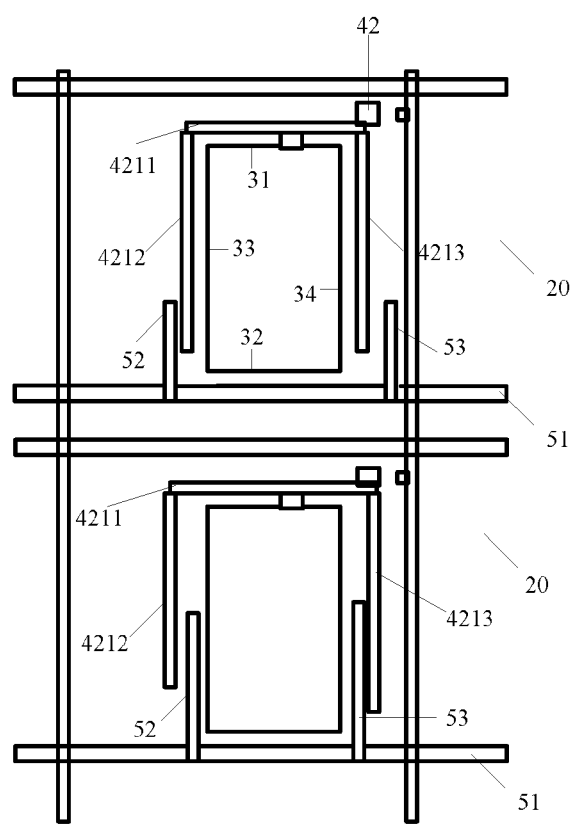
FIG. 4 is a schematic structural view of an array substrate according to an embodiment of the present disclosure.

FIG. 3 and FIG. 4 illustrate a form of the light blocking structure. The light blocking structure in FIG. 3 and FIG. 4 may be considered as a combination of the light blocking structures shown in FIG. 1 and FIG. 2 The second portion 52 of the common electrode line 50 as shown in FIG. 1 and the second extension line 4212 as shown in FIG. 2 may be disposed near the third edge 33 of the pixel electrode 30 together to function for blocking light at the third edge 33, and correspondingly, the third portion 53 of the common electrode line 50 as shown in FIG. 1 and the third extension line 4213 as shown in FIG. 2 are disposed near the fourth edge 34 of the pixel electrode 30 together to function for blocking light at the fourth edge 34.

Referring to FIG. 3 and FIG. 4, based on the above conception, optionally, the extension portion 421 is extended from the drain electrode 42 with the drain electrode 42 as a trunk, and includes a first extension line 4211 parallel to the first edge 31 of the pixel electrode 30 and further includes a second extension line 4212 and a third extension line 4213 that extends from the first extension line 4211. An orthographic projection of the first extension line 4211 on the plane where the pixel electrode 30 is located is located at the first edge 31 of the pixel electrode, an orthographic projection of the second extension line 4212 on the plane where the pixel electrode 30 is located is located at the third edge 33 of the pixel electrode, and an orthographic projection of the third extension line 4213 on the plane where the pixel electrode 30 is located is located at the fourth edge 34 of the pixel electrode. The common electrode line 50 includes a first portion 51 parallel to the second edge 32 of the pixel electrode 30, a second portion 52 located at the third edge 33 of the pixel electrode 30 and a third portion 53 located at the fourth edge 34 of the pixel electrode 30. An orthographic projection of the first portion 51 on the plane where the pixel electrode 30 is located is located at the second edge 32 of the pixel electrode 30, an orthographic projection of the second portion 52 on the plane where the pixel electrode 30 is located is located at the third edge 33 of the pixel electrode 30 and an orthographic projection of the third portion 53 on the plane where the pixel electrode 30 is located is located at the fourth edge 34 of the pixel electrode 30. With this configuration, the first extension line 4211 and the first portion 51 respectively form two sides of the light blocking structure, the second extension line 4212 and the second portion 52 form one side of the light blocking structure together, and the third extension line 4213 and the third portion 53 form one side of the light blocking structure together.

Correspondingly, based on the rectangular pixel electrode 30, optionally, the second extension line 4212 and the third extension line 4213 are both perpendicular to the first extension line 4211 and the orthographic projections of the second portion 52 and the third portion 53 on the plane where the pixel electrode 30 is located are both perpendicular to the orthographic projection of the first portion 51 on the plane where the pixel electrode 30 is located, so as to form an orthographic projection of the light blocking structure in a regular shape. Further, the orthographic projections of the second portion and the third portion on the plane where the pixel electrode 30 is located are both connected with the orthographic projection of the first portion 51 on the plane where the pixel electrode 30 is located, such that in the plane, if the extension portion 421 itself has no gap, the projection of the common electrode line 50 is also an integral structure without gap, thereby further improving light blocking performance. In the embodiment, the light blocking structure includes the first extension line 4211, the first portion 51, the second extension line 4212 and the second portion 52 that correspond to the third edge, and the third extension line 4213 and the third portion 53 that correspond to the fourth edge.

Figure 5:
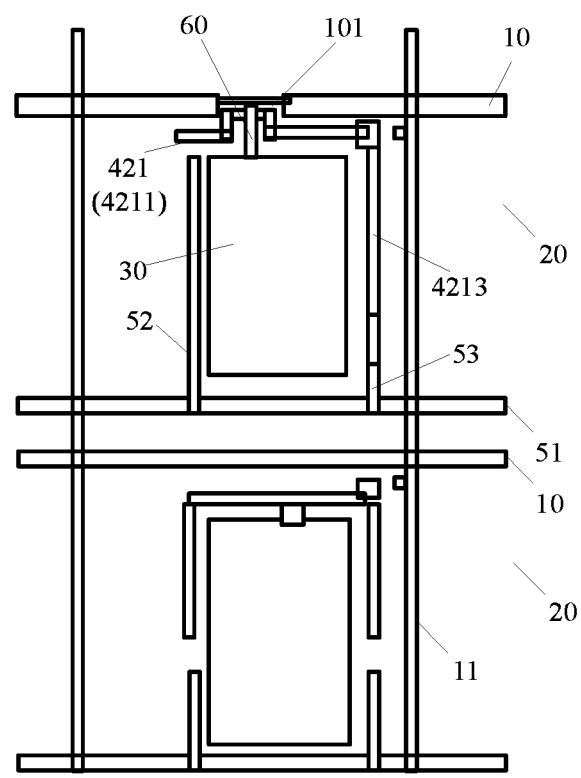
FIG. 5 is a schematic structural view of an array substrate according to an embodiment of the present disclosure.

A form of the light blocking structure is illustrated in FIG. 5. Referring to the first pixel unit 20 in FIG. 5, an extension portion 421 is extended from a drain electrode 42 with the drain electrode 42 as a trunk and includes a first extension line 4211 parallel to the first edge 31 of the pixel electrode 30 and further includes a third extension line 4213 that extend from the first extension line 4211. An orthographic projection of the first extension line 4211 on the plane where the pixel electrode 30 is located is located at the first edge 31 of the pixel electrode, and an orthographic projection of the third extension line 4213 on the plane where the pixel electrode 30 is located is located at the fourth edge 34 of the pixel electrode. The common electrode line 50 includes a first portion 51 parallel to the second edge 32 of the pixel electrode 30, a second portion 52 located at the third edge 33 and a third portion 53 located at the fourth edge 34. An orthographic projection of the first portion 51 on the plane where the pixel electrode 30 is located is located at the second edge 32 of the pixel electrode 30, an orthographic projection of the second portion 52 on the plane where the pixel electrode 30 is located is located at the third edge 33 of the pixel electrode 30 and an orthographic projection of the third portion 53 on the plane where the pixel electrode 30 is located is located at the fourth edge 34 of the pixel electrode 30, so that the first extension line 4211 and the first portion 51 respectively form two sides of the light blocking structure, the second portion 52 forms one side of the light blocking structure and the third extension line 4213 and the third portion 53 form one side of the light blocking structure together. That is, in the embodiment, the light blocking structure includes the first extension line 4211 corresponding to the first edge, the third extension line 4213 and the third portion 53 that correspond to the fourth edge, the second portion corresponding to the third edge, and the first portion 51 corresponding to the second edge.

Correspondingly, based on the rectangular pixel electrode 30, optionally, the third extension line 4213 is perpendicular to the first extension line 4211, and the orthographic projections of the second portion 52 and the third portion 53 on the plane where the pixel electrode 30 is located are both perpendicular to the orthographic projection of the first portion 51 on the plane where the pixel electrode 30 is located, so as to form the light blocking structure in a regular shape. Further, the orthographic projections of the second portion and the third portion on the plane where the pixel electrode 30 is located are connected with the orthographic projection of the first portion 51 on the plane where the pixel electrode 30 is located, such that in the plane, if the extension portion 421 itself has no gap, the projection of the common electrode line 50 is also an integral structure without gap, thereby further improving light blocking performance.

In the above various exemplary embodiments, depending on actual requirements, for example, depending on requirements for forming a storage capacitor, the first portion 51, the second portion 52 and the third portion 53 of the common electrode line 50 may be set in the same layer, or may not be set in the same layer. Of course, the solution is more than just suitable for the above three forms, and correspondingly, the portions of the common electrode line 50 may be disposed in the same layer, or may not be disposed in the same layer.

Optionally, the extension portion 421 of the drain electrode and the common electrode line 50 may be arranged in the same layer or in different layers. For example, the first portion 51, the second portion 52 and the third portion 53 of the common electrode line are not arranged in the same layer, that is, the first portion 51, the second portion 52 and the third portion 53 are arranged in different layers. In other words, at least one of the portions is arranged in a different layer from the others.

Referring to the first pixel unit 20 as shown in FIG. 3, for example, in order to further perfect the light blocking structure, the first portion 51, the second portion 52 and the third portion 53 may be arranged in different layers such that the second portion 52 and the second extension line 4212 are arranged in different layers. Meanwhile, there is an area of overlap between the orthographic projections of the second extension line 4212 and the second portion 52 on the plane where the pixel electrode 30 is located. For example, an end of the orthographic projection of the second extension line 4212 on the plane where the pixel electrode 30 is located overlaps an end of the orthographic projection of the second portion 52 on the plane where the pixel electrode 30 is located. In this way, an end of the second extension line 4212 and an end of the second portion 52 will form a storage capacitor, which facilitates driving liquid crystal molecules at the edge of the pixel electrode 30 so as to improve performance of the array substrate. Furthermore, in the plane where the pixel electrode 30 is located, a portion of the light blocking structure corresponding to the third edge 33 has no gap, thereby achieving a good light blocking effect.

In another embodiment, the third extension line 4213 and the third portion 53 may also be arranged in different layers, and there is an area of overlap between the orthographic projections of the third extension line 4213 and the third portion 53 on the plane where the pixel electrode 30 is located. For example, an end of the orthographic projection of the third extension line 4213 on the plane where the pixel electrode 30 is located overlaps an end of the orthographic projection of the third portion 53 on the plane where the pixel electrode 30 is located, also forming a storage capacitor.

Referring to the first pixel unit 20 as shown in FIG. 5, in an embodiment, in order to further perfect the light blocking structure, the first portion 51, the second portion 52 and the third portion 53 may be arranged in different layers such that the third portion 53 and the third extension line 4213 are arranged in different layers while there is an area of overlap between the orthographic projections of the third extension line 4213 and the third portion 53 on the plane where the pixel electrode 30 is located. For example, an end of the orthographic projection of the third extension line 4213 on the plane where the pixel electrode 30 is located overlaps an end of the orthographic projection of the third portion 53 on the plane where the pixel electrode 30 is located. In this way, an end of the third extension line 4213 and an end of the third portion 53 will form a storage capacitor.

It is noted that, in terms of the orthographic projections on the plane where the pixel electrode 30 is located, the second extension line 4212 and the first extension line 4211 are connected with each other and thus it may be understood that an end of the second extension line 4212 is connected with the first extension line 4211 and the other end of the second extension line 4212 is the end of the orthographic projection of the second extension line 4212 on the plane where the pixel electrode 30 is located. Similarly, the end of the orthographic projection of the third extension line 4213 on the plane where the pixel electrode 30 is located is the orthographic projection of the end of the third extension line 4213 away from the first extension line 4211. Thus, it is conceivable that the end of the orthographic projection of the second portion 52 on the plane where the pixel electrode 30 is located is an orthographic projection of the end, away from the first portion 51, of the second portion 52 on the plane where the pixel electrode 30 is located, and an end of the orthographic projection of the third portion 53 on the plane where the pixel electrode 30 is located is an orthographic projection of the end, away from the first portion 51, of the third portion 53 on the plane where the pixel electrode 30 is located.

In the above schemes of formation of the storage capacitor, the storage capacitor may be formed at an edge of the pixel electrode 30 at its one side, or the storage capacitors may be formed at edges of the pixel electrode 30 at its two sides, respectively, so as to further improve performance of the array substrate. Meanwhile, the portions of the light blocking structure corresponding to the edges of the pixel electrode 30 at its two sides have no gap, which further improves light blocking performance. In an embodiment, there is no gap among the orthographic projections of the portions of the common electrode line 50 on the plane where the pixel electrode 30 is located, and the corresponding light blocking structure is closed, thereby achieving a better light blocking effect.

Referring to FIG. 4, according to another embodiment of the present disclosure, there are further various forms of closed light blocking structures in which no gap exists among the orthographic projections of the portions of the common electrode line 50 on the plane where the pixel electrode 30 is located. For example, the orthographic projection of the second extension line 4212 on the plane where the pixel electrode 30 is located may be parallel to the orthographic projection of the second portion 52 on the plane where the pixel electrode 30 is located and the ends of the orthographic projections of them overlap with each other in the plane. In this way, the portion of the light blocking structure corresponding to the third edge 33 has no gap and dual light blocking effect is obtained at the ends of the second extension line 4212 and the second portion 52. Meanwhile, the orthographic projection of the third extension line 4213 on the plane where the pixel electrode 30 is located and the orthographic projection of the third portion 53 on the plane where the pixel electrode 30 is located are parallel to each other and the ends of the orthographic projections of them overlap with each other in the plane. In this way, the portion of the light blocking structure corresponding to the fourth edge 34 also has no gap and a dual light blocking effect is also obtained at the ends of the third extension line 4213 and the third portion 53. The light blocking structure at the edges of the pixel electrode 30 is thus closed. In another embodiment, based on the scheme in which the second extension line 4212 and the third extension line 4213 are both perpendicular to the first extension line 4211, the orthographic projections of the second extension line 4212, the third extension line 4213, the second portion 52 and the third portion 53 on the plane where the pixel electrode 30 is located are parallel to each other.

The closed light blocking structure may be achieved in the following specific manner. Referring to the first pixel unit 20 in FIG. 4, the orthographic projection of the second extension line 4212 on the plane where the pixel electrode 30 is located is closer to the third edge 33 of the pixel electrode 30 than the orthographic projection of the second portion 52 on the plane where the pixel electrode 30 is located, and the orthographic projection of the third extension line 4213 on the plane where the pixel electrode 30 is located is closer to the fourth edge 34 of the pixel electrode 30 than the orthographic projection of the third portion 53 on the plane where the pixel electrode 30 is located. That is, the orthographic projections of the second extension line 4212 and the third extension line 4213 on the plane where the pixel electrode 30 is located extend into a region defined by the orthographic projections of the second portion 52 and the third portion 53 on the plane where the pixel electrode 30 is located.

Referring to the second pixel unit 20 as shown in FIG. 4, the above closed light blocking structure may be achieved in a reverse manner. That is, the orthographic projections of the second portion 52 and the third portion 53 on the plane where the pixel electrode 30 is located extend into a region defined by the orthographic projections of the second extension line 4212 and the third extension line 4213 on the plane where the pixel electrode 30 is located. Specifically, the orthographic projection of the second extension line 4212 on the plane where the pixel electrode 30 is located is further away from the third edge 33 of the pixel electrode 30 than the orthographic projection of the second portion 53 on the plane where the pixel electrode 30 is located and the orthographic projection of the third extension line 4213 on the plane where the pixel electrode 30 is located is further away from the fourth edge 34 of the pixel electrode 30 than the orthographic projection of the third portion 53 on the plane where the pixel electrode 30 is located It is supplemented that in the embodiments, "closed" means that the light blocking structure is provided at the entire edge of the pixel electrode 30. It is described visibly that, with respect to the edge of the pixel electrode 30, the light blocking structure gives no gap to expose the edge, rather than the light blocking structure itself having to be continuous and closed.

In the embodiment, in the solution in which the common electrode line 50 includes the first portion 51, the second portion 52 and the third portion 53, vertical distances from the orthographic projections of the portions on the plane where the pixel electrode 30 is located to the respective edges may be set in various ways. For example, the vertical distance between the orthographic projection of the second portion 52 on the plane where the pixel electrode 30 is located and the third edge 33 may be greater than the vertical distance between the orthographic projection of the third portion 53 on the plane where the pixel electrode 30 is located and the fourth edge 34. In an embodiment of the present disclosure, other situation may exist, that is, referring to the first pixel unit 20 as shown in FIG. 5, the vertical distance between the orthographic projection of the second portion 52 on the plane where the pixel electrode 30 is located and the third edge 33 is less than the vertical distance between the orthographic projection of the third portion 53 on the plane where the pixel electrode 30 is located and the fourth edge 34.

According to the embodiment of the present disclosure, vertical distances from the orthographic projections of the portions of the extension portion 421 on the plane where the pixel electrode 30 is located to the respective edges may be set in various ways. For example, the vertical distance between the orthographic projection of the second extension line 4212 on the plane where the pixel electrode 30 is located and the third edge 33 may be greater than the vertical distance between the orthographic projection of the third extension line 4213 on the plane where the pixel electrode 30 is located and the fourth edge 34. Alternatively, according to an embodiment, other situation may exist, that is, the vertical distance between the orthographic projection of the second extension line 4212 on the plane where the pixel electrode 30 is located and the third edge 33 is less than the vertical distance between the orthographic projection of the third extension line 4213 on the plane where the pixel electrode 30 is located and the fourth edge 34.

Further, in another embodiment of the present disclosure, the orthographic projection of the common electrode line 50 on the plane where the pixel electrode 30 is located and the pixel electrode 30 may also overlap such that a storage capacitor is formed between the common electrode line 50 and the pixel electrode 30, thereby improving performance of the array substrate.

In another embodiment of the present disclosure, the orthographic projection of the extension portion 421 of the drain electrode 42 on the plane where the pixel electrode 30 is located and the pixel electrode 30 may also overlap such that a storage capacitor is formed between the extension portion 421 and the pixel electrode 30, thereby improving performance of the array substrate.

It must be ensured that the two structures forming the storage capacitor are arranged in different layers and of course the above two cases are no exception. However, in the light blocking structure in the embodiment, among the portions of the extension portion 421 of the drain electrode 42 and the portions of the common electrode line 50, at least one group of the extension portion 421 and the common electrode line 50 may be arranged in different layers and thus at least one storage capacitor may be obtained, thereby improving performance of the array substrate.

The closed light blocking structures according to embodiments of the present disclosure are specifically described above. In another embodiment of the present disclosure, an array substrate may include an unclosed light blocking structure. Referring to the second pixel unit as shown in FIG. 3, for example, the extension portion 42 and the common electrode line 50 are arranged in the same layer and an orthographic projection of a portion of the extension portion 421 on the plane where the pixel electrode 30 is located and an orthographic projection of a portion of the common electrode line 50 on the plane where the pixel electrode 30 is located are located on the same straight line. In this case, there is a gap between the orthographic projections of the two portions. It is one of the unclosed light blocking structures.

Referring to FIG. 5, it is noted that the drain electrode 42 is connected with the pixel electrode 30 through a via hole 60. In the embodiment, the extension portion 421 of the drain electrode 42 may be connected with the pixel electrode 30 through the via hole 60. In this way, the via hole 60 may be disposed at a position away from the thin film transistor so as to avoid a phenomenon that the thin film transistor is eroded by an etching solution during etching the via hole 60 or the performance of the thin film transistor is adversely affected by residue from the technological process and the like in case that the via hole 60 is otherwise disposed near the thin film transistor.

Further, in the embodiments of the present disclosure, a groove 101 may be disposed in a position of the gate line 10 away from the thin film transistor. The groove 101 corresponds to an area where the via hole 60 is located, such that the area where the via hole 60 is located is within the groove 101, thereby saving layout space. For example, when the thin film transistor of the pixel unit 20 is located at an end of the gate line 10 corresponding to the pixel unit 20, the groove 101 may be disposed at a non-end position of the gate line 10, that is, at any position between two ends of the gate line 10, such that the via hole 60 is apart away from the thin film transistor.

Figure 6:
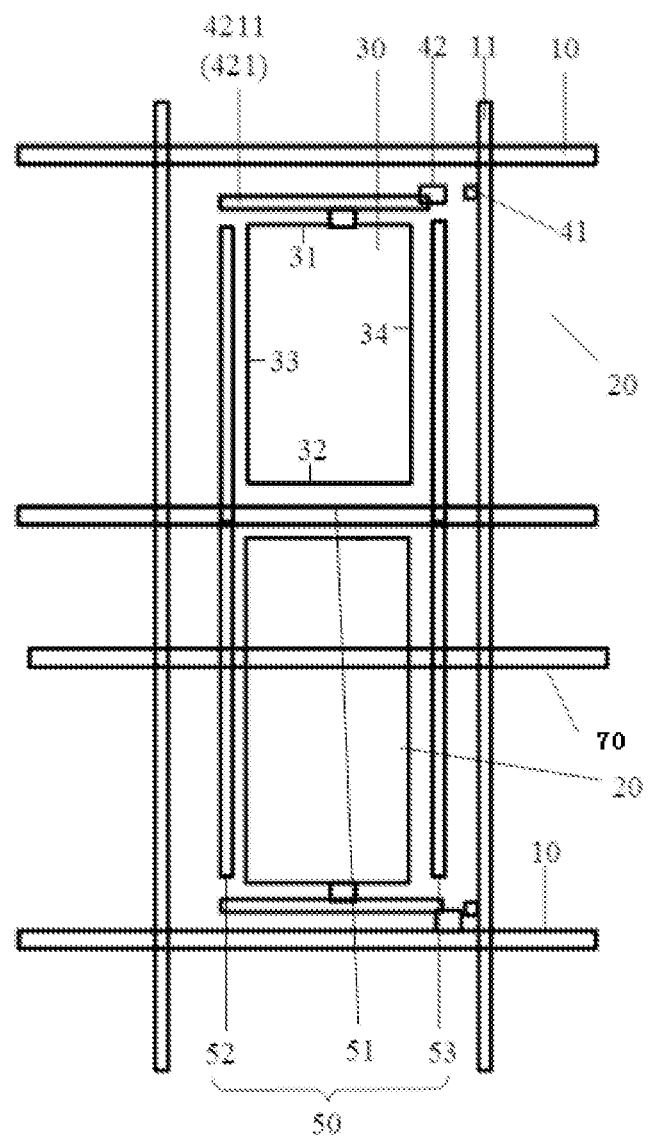
FIG. 6 shows a schematic structural view of an array substrate according to an embodiment of the present disclosure.

Referring to FIG. 6, the embodiment provides an array substrate including a plurality of gate lines 10 and a plurality of data lines 11 which cross the gate lines 10; the plurality of gate lines 10 crossing the plurality of data lines 11 to bound pixel units 20. Each pixel unite 20 includes a pixel electrode 30 and a thin film transistor including a gate electrode, a source electrode 41 and a drain electrode 42. The gate electrode is connected with the gate line 10, the source electrode 41 is connected with the data line 11 and the drain electrode 42 is connected with the pixel electrode 30. Of course, in an embodiment, the gate electrode and the gate line may be of a one-piece structure. The array substrate in the embodiment further includes a common electrode line 50. One common electrode line 50 is shared by two pixel units which are adjacent in a vertical direction in the figures, i.e., a direction in which the data line extends. With this configuration, the number of the common electrode lines may be reduced. For example, the first portion 51 of the common electrode line 50 is shared by the adjacent pixel units in the figures (i.e., two upper and lower pixel units as shown in FIG. 6). The drain electrode 42 includes an extension portion 421, and the common electrode line 50 and the extension portion 421 cooperate with each other to form a light blocking structure such that an orthographic projection of the light blocking structure on the plane where the pixel electrode 30 is located is located at the edge of the pixel electrode 30, forming the corresponding projection of the light blocking structure. That is, the orthographic projection of the common electrode line 50 on the plane where the pixel electrode 30 is located and the orthographic projection of the extension portion 421 on the plane where the pixel electrode 30 is located surround the edge of the pixel electrode 30 together to form the projection of the light blocking structure. Of course, the orthographic projection of the light blocking structure may be closed or unclosed.

Optionally, the common electrode line 50 includes a first portion 50, a second portion 52 and a third portion 53. The first portion 51 is substantively parallel to the gate line and the second portion 52 and the third portion 53 are substantively parallel to the data line. Preferably, orthographic projections of the second portion 52 and the third portion 53 on the plane where the pixel electrode 30 is located may be perpendicular to the first portion 51.

Optionally, the array substrate further includes an auxiliary connection line 70, and the auxiliary connection line 70 may extend in a direction (i.e., a horizontal direction in the Figure) in which the gate line extends and electrically connects the second portion 52 and the third portion 53 of the common electrode line 50 for the same pixel unit 20.

Figure 7:
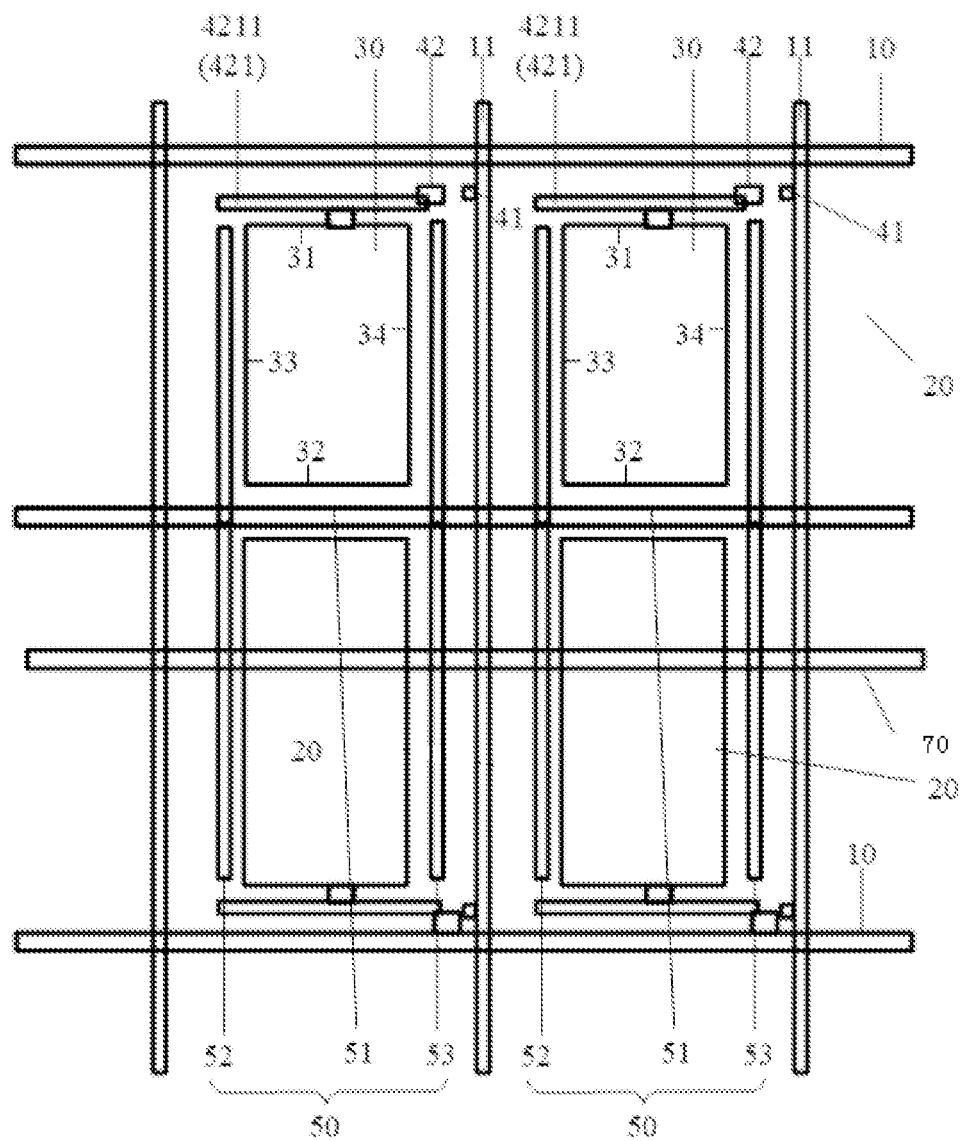
FIG. 7 shows a schematic structural view of an array substrate according to an embodiment of the present disclosure.

Optionally, the auxiliary connection line 70 may electrically connect the common electrode lines of the adjacent pixel units 20. Specifically, the auxiliary connection line 70 extends in the horizontal direction and the second portions and the third portions of the adjacent pixel units 20 cross and are electrically connected to the auxiliary connection line. Due to provision of the auxiliary connection line 70, the second portion and the third portion of the common connection line are connected in parallel with each other, thereby reducing resistance. FIG. 7 shows a situation where the auxiliary connection line 70 electrically connects the second portions and the third portions of the adjacent pixel units 20. It should be known that FIG. 7 shows only two pixel units 20 and in actual application, the auxiliary connection line 70 may electrically connect a plurality of adjacent pixel units 20.

In the embodiment, the drain electrode 42 of the thin film transistor on the array substrate is extended to form the extension portion 421 and, meanwhile, the common electrode line 50 is provided on the array substrate such that the orthographic projections of the extension portion 421 and the common electrode line 50 on the plane where the pixel electrode 30 is located form an orthographic projection of a light blocking structure surrounding an edge of the pixel electrode 30 together and the light blocking structure corresponding to the orthographic projection of the light blocking structure can function to block light at the edge of the pixel electrode 30, reducing light leakage at the edge region of the pixel electrode 30 as much as possible and thus improving display quality of a display device.

A method of manufacturing the above array substrate will be accordingly provided as below.

In a step S1, a gate electrode metal layer is formed on a substrate base and a patterning process is performed on the gate electrode metal layer to form patterns of the gate line, the gate electrode and the required common electrode line.

Optionally, the gate electrode metal layer may be deposited by a sputtering process and may be made of a metal such as copper, aluminum, molybdenum, titanium, chromium, and tungsten, or may be made of an alloy of these metals.

In the embodiment, in the step S1, a gate line may be formed in a one-layer structure, or in a multi-layer structure. For example, the gate line may be formed in a multi-layer structure of stacking layers of molybdenum, aluminum and molybdenum, or in a multi-layer structure of stacking layers of titanium, copper, and titanium, or in a multi-layer structure of stacking layers of molybdenum, titanium, and copper.

In a step S2, a gate protecting layer is formed on the substrate base having the gate line, the gate electrode and the common electrode line.

Optionally, the gate protecting layer may be formed by a plasma-enhanced chemical vapor deposition process, and may be made of silicon nitride or silicon oxide. The formed gate insulating layer may be in a one-layer structure or in a multi-layer structure, such as in a multi-layer structure of stacking layers of silicon nitride and silicon oxide.

In a step S3, a semiconductor layer is formed on the gate protecting layer and a patterning process is performed on the semiconductor layer to form an active layer.

Optionally, the semiconductor layer may be formed by depositing amorphous silicon by a plasma-enhanced chemical vapor deposition process or by depositing an oxide semiconductor (such as, indium-gallium-zinc oxide) by a sputtering process.

In a step S4, a source-drain metal layer is formed on the active layer and a patterning process is performed on the source-drain metal layer to form patterns of the data line, the source electrode and the drain electrode.

Optionally, the pattern of the drain electrode includes a pattern of the extension portion that cooperates with the common electrode line.

Optionally, the source-drain metal layer may be deposited by a sputtering process and may be made of a metal such as copper, aluminum, molybdenum, titanium, chromium, and tungsten, or may be made of an alloy of these metals.

In a step S5, a passivation layer is formed on the substrate base having the data line, the source electrode and the drain electrode and a pattern of the via hole is formed by a patterning process. The via hole is located over the drain electrode.

Optionally, the via hole may be located over the extension portion of the drain electrode. Further, the via hole may be apart away from the corresponding thin film transistor.

Optionally, the passivation layer may be made of inorganic material, such as silicon nitride. Accordingly, the passivation layer may be formed by depositing silicon nitride on the substrate base having the data line, the source electrode and the drain electrode, by a plasma-enhanced chemical vapor deposition process. The passivation layer may also be made of organic material, such as resin. Accordingly, the passivation layer may be formed by coating a resin layer on the substrate base having the data line, the source electrode and the drain electrode.

In a step S6, a transparent conductive film is formed on the passivation layer and a pattern of the pixel electrode is formed by a patterning process such that the pixel electrode is electrically connected with the drain electrode by the via hole.

Optionally, the pixel electrode may be electrically connected with the extension portion of the drain electrode.

Optionally, the transparent conductive film may be formed by a sputtering process and may be made of some transparent metal oxide such as indium-tin oxide or indium-zinc oxide.

In the above steps, the patterning process may include processes of coating photoresist, exposure, development and etching.

By the method, the array substrate according to the embodiment may be formed. The array substrate includes the above light blocking structure.

An embodiment of the present disclosure provides a display device including the above array substrate.

The extension portion extended from the drain electrode and the common electrode line are provided at the edge of the pixel electrode of the above array substrate to form the light blocking structure together, and the orthographic projection of the light blocking structure on the plane where the pixel electrode is located forms a closed projection or unclosed projection at the edge of the pixel electrode such that the light blocking structure can function to block light at the edge of the pixel electrode, reducing light leakage at the edge of the pixel electrode and improving display quality of the display device.

It is noted that the display device provided by the embodiments may be any component or product having a display function, such as a liquid crystal display panel, an electronic paper, a mobile telephone, a tablet computer, a television, a display, a notebook computer, a digital frame, and a navigator.

The above are only some specific implementations of the present invention. It should be known that based on the solutions of the disclosed embodiments, those skilled in the art can think of other embodiments of the present disclosure. The embodiments and the embodiments those skilled in the art think of can be combined with each other, for example, the drains described or shown in different embodiments can be applied to the array substrate of one of the embodiments.

The above description merely relates to embodiments of the present disclosure and the protection scope of the present disclosure is not limited to this. Modification or replacement that can be obtained by those skilled in the art in the scope of the present disclosure should be covered by the scope of the present disclosure. Thus, the protection scope of the present disclosure should be defined by the attached claims.

The invention claimed is:

1. An array substrate, comprising a plurality of gate lines extending generally along a first direction and a plurality of data lines extending generally along a second direction, the first direction and the second direction being perpendicular to each other, the gate lines and the data lines crossing to define a plurality of pixel units, each of the pixel units comprising a pixel electrode and a thin film transistor and the thin film transistor comprising a drain, wherein the drain comprises a drain extension, and the drain extension comprises a first extension line, a second extension line, and a third extension line, wherein the first extension line extends in the first direction, the second extension line and the third extension line extend in the second direction, and the first extension line is located between the second extension line and the third extension line;

the array substrate further comprises a common electrode line and an orthographic projection of the common electrode line on the plane where the pixel electrode is located and an orthographic projection of the first extension line on the plane where the pixel electrode is located do not overlap; and the orthographic projection of the common electrode line on the plane where the pixel electrode is located overlaps orthographic projections of the second extension line and the third extension line on the plane where the pixel electrode is located.

2. The array substrate as claimed in claim 1, wherein the common electrode line comprises a first portion extending in the first direction, and a second portion extending in the second direction and/or a third portion extending in the second direction; wherein the drain extension and the common electrode line are arranged such that:

an orthographic projection of at least one of the second portion and the third portion of the common electrode line on the plane where the pixel electrode is located has an overlapping part with an orthographic projection of the third extension line on the plane where the pixel electrode is located.

3. The array substrate as claimed in claim 2, wherein orthographic projections of the first portion, the second portion and the third portion of the common electrode line on the plane where the pixel electrode is located form a non-closed structure.

4. The array substrate as claimed in claim 2, wherein the common electrode line includes the first portion extending in the first direction and the third portion extending in the second direction, which are arranged in the same layer or in different layers.

5. The array substrate as claimed in claim 2, wherein at least one of the first extension line, the second extension line and the third extension line of the drain extension is provided in the same layer as at least a part of the common electrode line.

6. The array substrate as claimed in claim 2, wherein the array substrate further comprises an auxiliary connection line for electrically connecting the common electrode lines in adjacent pixel units.

7. The array substrate as claimed in claim 6, the auxiliary connection line extends in the first direction to electrically connect the second portion and the third portion of the common electrode lines in adjacent two of the pixel units, an orthographic projection of the auxiliary connection line on the plane where the pixel electrode is located overlaps the pixel electrode.

8. An array substrate, comprising:

a plurality of gate lines extending generally in a first direction and a plurality of data lines extending generally in a second direction, the first direction and the second direction being perpendicular to each other, the gate lines and the data lines crossing to define a plurality of pixel units, each of which includes a pixel electrode and a thin film transistor;

wherein, the array substrate further includes a common electrode line, wherein the common electrode line includes a first portion extending in the first direction, a second portion and a third portion extending in the second direction;

orthographic projections of the second portion of the common electrode line and the third portion of the common electrode line on a plane where the pixel electrode is located are respectively parallel to and are not equally distanced to opposite edges of the pixel electrode extending in the second direction.

9. The array substrate as claimed in claim 8, wherein for one of the pixel units, a length of the second portion of the common electrode line and a length of the third portion of the common electrode line extending in the second direction are different or the same.

10. The array substrate as claimed in claim 9, wherein the thin film transistor comprises a drain, the length of the third portion of the common electrode line at a side adjacent to the drain in the second direction is shorter than the length of the second portion of the common electrode line at the side adjacent to the drain extending in the second direction.

11. The array substrate as claimed in claim 9, wherein for adjacent two of the pixel units, the second portions or the third portions of the common electrode lines at the same side of the pixel electrode have different lengths in the second direction.

12. The array substrate as claimed in claim 8, wherein for adjacent two of the pixel units, distances between the second portions of the common electrode lines and corresponding edges of the pixel electrodes are different; and/or distances between the third portions of the common electrode lines and corresponding edges of the pixel electrodes are different.

13. The array substrate as claimed in claim 8, wherein the thin film transistor comprises a drain, and the drain comprises an drain extension, and distal ends, at a side closer to the drain and a gate line in the second direction, of the orthographic projections of the second portion and the third portion of the common electrode line on the plane where the pixel electrode is located do not overlap the drain.

14. The array substrate as claimed in claim 8, wherein the thin film transistor comprises a drain, and the drain comprises an drain extension, and distal ends, in the second direction, of the orthographic projections of the second portion and the third portion of the common electrode line on the plane where the pixel electrode is located overlap the drain extension.

15. The array substrate as claimed in claim 8, wherein the common electrode line further comprises an auxiliary connection line extending in the first direction and electrically connecting the second portion and the third portion of the common electrode line in one of the pixel units, and an orthographic projection of the auxiliary connection line on the plane where the pixel electrode is located overlaps the pixel electrode.

16. The array substrate as claimed in claim 8, wherein the thin film transistor comprises a drain, and the drain comprises an drain extension, the common electrode line and the drain extension together form a light blocking structure, and an orthographic projection of the light blocking structure on the plane where the pixel electrode is located is located at or near the edge of the pixel electrode.

17. The array substrate as claimed in claim 8, wherein the common electrode line is in the same layer as the gate line, and the second portion and the third portion of the common electrode line are in the same layer.

18. The array substrate as claimed in claim 8, wherein the first portion of the common electrode line is located between adjacent two of the pixel electrodes, and the second portion and the third portion of the common electrode line respectively extend from the first portion of the common electrode line in the second direction toward both sides of the first portion of the common electrode line.

19. A display device comprising the array substrate according to claim 1.

20. A display device comprising the array substrate according to claim 8.

* * * * *